United States Patent [19]
Desorcie et al.

[11] Patent Number: 5,885,135
[45] Date of Patent: *Mar. 23, 1999

[54] CMP WAFER CARRIER FOR PREFERENTIAL POLISHING OF A WAFER

[75] Inventors: Daniel D. Desorcie, St. Albans; Richard J. Lebel, Colchester; Charles A. McKinney, Chazy; Rock Nadeau, Jericho; Timothy J. Rickard, Jr., Milton; Paul H. Smith, Jr., Essex Junction; Douglas K. Sturtevant, Essex Junction; Matthew T. Tiersch, Essex Junction, all of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 842,129

[22] Filed: Apr. 23, 1997

[51] Int. Cl.$^6$ .................................................. B24B 1/00
[52] U.S. Cl. ........................... 451/41; 451/384; 451/387
[58] Field of Search ..................................... 451/285–289, 451/41, 364, 379, 384, 385, 388, 390, 397, 398, 42, 28

[56] References Cited

U.S. PATENT DOCUMENTS

| | | |
|---|---|---|
| 4,270,316 | 6/1981 | Krämer et al. . |
| 4,313,284 | 2/1982 | Walsh . |
| 4,910,155 | 3/1990 | Cote et al. . |
| 4,918,869 | 4/1990 | Kitta . |
| 5,036,630 | 8/1991 | Kaanta et al. . |
| 5,127,196 | 7/1992 | Morimoto et al. ........................ 451/285 |
| 5,212,116 | 5/1993 | Yu . |
| 5,232,875 | 8/1993 | Tuttle et al. . |
| 5,257,478 | 11/1993 | Hyde et al. . |
| 5,394,655 | 3/1995 | Allen et al. . |
| 5,398,459 | 3/1995 | Okumura et al. ........................ 451/286 |
| 5,423,716 | 6/1995 | Strasbaugh . |
| 5,476,414 | 12/1995 | Hirose et al. ............................ 451/288 |
| 5,486,129 | 1/1996 | Sandhu et al. . |
| 5,533,924 | 7/1996 | Stroupe et al. . |
| 5,573,448 | 11/1996 | Nakazima et al. ....................... 451/287 |
| 5,582,534 | 12/1996 | Shendon et al. ......................... 451/288 |
| 5,645,474 | 7/1997 | Kubo et al. .............................. 451/287 |
| 5,647,792 | 7/1997 | Katsuoka et al. ........................ 451/288 |
| 5,651,724 | 7/1997 | Kimura et al. ........................... 451/285 |

*Primary Examiner*—David A. Scherbel
*Assistant Examiner*—Derris Holt Banks
*Attorney, Agent, or Firm*—DeLio & Peterson, LLC; John J. Tomaszewski; Howard J. Walter, Jr.

[57] ABSTRACT

An apparatus for polishing a semiconductor wafer is provided which includes a wafer carrier having on its lower surface a non-uniform surface structure means to vary the force against a wafer during a polishing operation so that the polishing is enhanced and imparts a planar surface across the polished wafer. Preferred non-uniform surface structure means include use of a wafer carrier having on its lower surface a backing film having a first central portion having a predetermined compressibility and a second peripheral portion having a different compressibility than the first portion. Another non-uniform surface structure means to vary the force against the wafer comprises a wafer carrier having on its lower surface a raised circumferential region around the periphery of the carrier.

17 Claims, 3 Drawing Sheets

CMP WAFER CARRIER FOR PREFERENTIAL POLISHING OF A WAFER

BACKGROUND OF THE INVENTION

1. Field of the Invention

The present invention relates to processing of semiconductor wafers such as slices of semiconductor silicon and, more particularly, to an improved method and apparatus for polishing the wafers in the chemical-mechanical planarization process in order to achieve a high degree of wafer planarity.

2. Problem to be Solved

In the manufacture of integrated circuits, wafer surface planarity is of extreme importance. Photolithographic processes are typically pushed close to the limit of resolution and it is essential that the wafer surface be highly planar so that the electromagnetic or other radiation used to create the integrated circuit may be accurately focused in a single level thus resulting in precise imaging over the entire surface of the wafer. Wavy, curved or wedge-shaped semiconductor disks result in lack of definition when, for example, a photosensitive resist is applied to the surface of the disk and exposed.

In order to achieve the degree of planarity required to produce ultra high density integrated circuits, chemical-mechanical planarization processes are now typically employed in the industry. In general, the chemical-mechanical planariztion (CMP) process involves pressing a semiconductor wafer against a moving polishing surface that is wetted with a chemically reactive, abrasive slurry. Slurries are usually either basic or acidic and generally contain alumina or silica particles. The polishing surface is typically a planar pad made of a relatively soft, porous material such as blown polyurethane. The pad is usually mounted on a planar platen.

In general, the wafer is secured to a carrier plate (or wafer carrier) by vacuum or by a mounting medium such as an adhesive, with the wafer having a force load applied thereto through the carrier by a pressure plate so as to press the wafer into frictional contact with a polishing pad mounted on a rotating turntable. The carrier and pressure plate also rotate as the result of either the driving friction from the turntable or rotation drive means directly attached to the pressure plate. In a typical polishing machine, the movement of the carrier is programmed to acquire a wafer from a first station, to transport the wafer to a polishing surface, to drive the wafer across the rotating polishing surface, to transport the wafer from the polishing surface to a second station, and to release the wafer at the second station. A typical way of securing and releasing the wafer is by the use of a vacuum head that includes a rigid perforated plate against which the wafer is drawn by applying a vacuum to a plenum lying above the perforated plate.

During polishing it has been found that when a load is imposed on the wafer the polishing action across the wafer is not uniform causing center-to-edge non uniformity in thickness and poor flatness of the wafer. The surface life of the polishing cloth is also a factor in effecting the planarity of the polished wafer. Frictional heat generated at the wafer surface enhances the chemical action of the polishing fluid and thus increases the polishing rate. The frictional head however can cause planarity problems unless the heat is evenly transmitted over the surface of the wafer and typical polishing systems utilize cooling systems to control the temperature of the polishing operation.

A number of attempts have been made in the prior art to improve the planarity of CMP operations. In U.S. Pat. No. 4,270,316 the uneven transmission of pressure which causes different degrees of abrasion of the polished disks is compensated for by the provision of soft elastic inserts placed between a pressure piston and the back of the carrier plate on which the disks to be polished are cemented. In U.S. Pat. No. 4,313,284 a deformable thin disk carrier is mounted through a resilient device to a rotatable pressure plate so that the carrier can be deformed to either a concave shape or convex shape depending on the polishing required. In U.S. Pat. No. 4,910,155 a dam is provided on the polishing plate so that the polishing pool of slurry completely immerses the polishing pad. In U.S. Pat. No. 4,918,869 the use of pressurized air acting on the pressure plate is provided so that the pressure on the wafer surface can be uniform. In U.S. Pat. No. 5,036,630 the wafer carrier comprises at least two (2) materials having different coefficients of thermal expansion which carrier imparts a desired convex or concave bias to the wafer during the polishing operation. In U.S. Pat. No. 5,423,716 the lower face of the backing plate of the wafer carrier includes a number of recessed areas to which a vacuum can selectively be applied. The vacuum is applied to suck a resilient membrane into the recessed areas to draw the wafer into position. The same apparatus can be used to apply a pressurized fluid to the wafer to exert a uniform downward pressure on the wafer. In U.S. Pat. No. 5,486,129 the pressure head of the wafer carrier contains a number of pressure applicators over the wafer surface which can be monitored and adjusted to vary the pressure on the wafer during the polishing operation.

In U.S. Pat. No. 5,232,875 a CMP apparatus is shown wherein the polishing pad is moved about in a plane parallel to the pad surface with either an orbital, fixed-direction vibratory or random-direction vibratory motion.

The disclosures of the above patents are hereby incorporated by reference.

Bearing in mind the problems and deficiencies of the prior art, it is therefore an object of the present invention to provide an apparatus, e. g., CMP apparatus, for polishing semiconductor wafers and other workpieces.

It is another object of the present invention to provide an improved method for polishing workpieces, e. g., wafers, using such polishing operations as the CMP system.

It is an additional object of the invention to provide wafer carriers for use in CMP apparatus and CMP processes to enhance operation of the apparatus and improve the flatness of a polished wafer.

It is further object of the invention to provide flat workpieces, including semiconductor wafers, made using the improved method and apparatus of the invention.

Other objects and advantages of the present invention will be readily apparent from the following description.

SUMMARY OF THE INVENTION

The above and other objects, which will be apparent to those skilled in the art, are achieved in the present invention which is directed in a first aspect to a method for polishing workpieces such as semiconductor wafers which comprises securing the wafer to the lower surface of wafer carrier means wherein the lower surface has a non-uniform surface which when a force is applied to the upper surface of the wafer carrier to contact the wafer with a polishing pad the wafer carrier provides a force which varies across the wafer surface such that the polishing process is enhanced to impart a planar polished wafer surface. Using the method and apparatus of the invention it has been found that the wafer is substantially flat to within a few millimeters of the wafer edge.

It is preferred that the non-uniform surface structure of the lower surface of the wafer provide a bending movement in the wafer so that the lower surface of the wafer during polishing has a concave or convex shape depending on the polishing results desired. A non-uniform surface structure may be defined as a surface which varies from one edge of the wafer carrier to the opposite edge, e.g., has raised portions, different materials of construction, etc.

In a further aspect of the invention, the wafer carrier non-uniform surface structure means to vary the force against and across the wafer surface comprises a wafer carrier having a backing film, which is integral to or more preferably secured to the lower surface of the wafer carrier, which backing film comprises a central first portion having a predetermined compressibility, preferably substantially incompressible, and a second peripheral portion having a higher compressibility (being more compressible) than the first portion. The central portion may also be compressible and the peripheral portion of a lower compressibility (e.g., incompressible) for certain applications.

In a further preferred aspect of the invention, the wafer carrier non-uniform surface structure means to vary the force against and across the wafer surface comprises a wafer carrier which has a raised circumferential region around the periphery of the lower surface of the carrier.

In an additional aspect of the invention an apparatus is provided for polishing a surface on a workpiece comprising:
a rotatable turntable assembly;
a polishing pad supported on said assembly;
a rotatable carrier, located above said assembly and adapted to hold a workpiece during polishing, with said workpiece secured on the lower surface of the carrier and positioned between said carrier and said polishing pad, said lower surface of the carrier having a non-uniform surface structure which when a force is applied to the upper surface of the wafer carrier to contact the wafer with the polishing pad the wafer carrier provides a force which varies across the wafer surface such that the polishing process imparts a flat polished wafer surface.

In another aspect of the invention a method is provided for polishing a surface on a workpiece employing a polishing apparatus wherein said workpiece is mounted to the lower surface of a rotatable carrier and contacted with a rotating polishing pad to effect a polishing action across said workpiece, which method comprises mounting said workpiece to the lower surface of the carrier which lower surface has a non-uniform surface structure which when a force is applied to the upper surface of the carrier to contact the workpiece with the polishing pad the wafer carrier provides a force which varies across the workpiece surface and imparts a flat polished surface to the workpiece.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
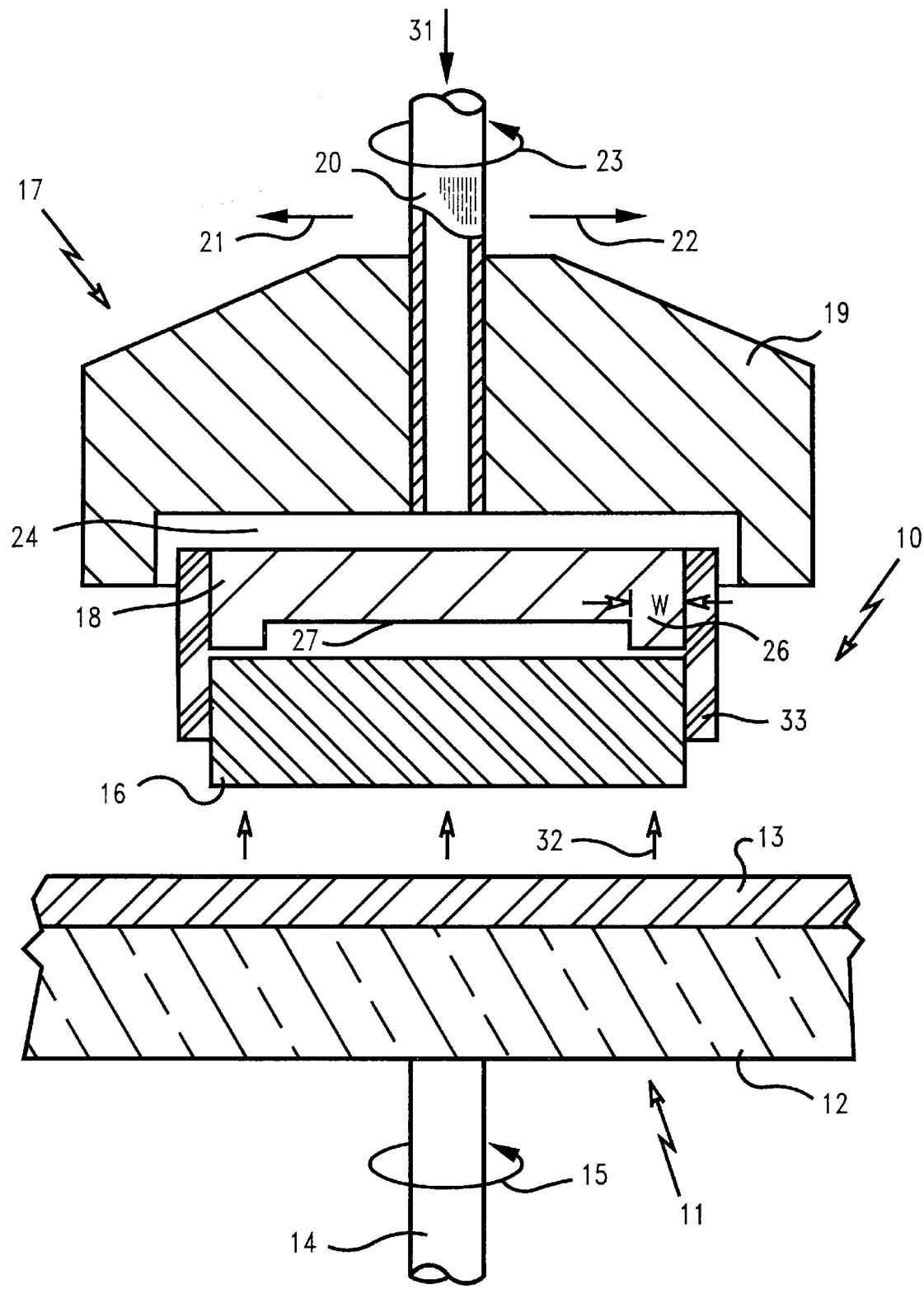
FIG. 1 is a cross-sectional view of a CMP polishing assembly utilizing a wafer carrier of the invention.

In describing the preferred embodiment of the present invention, reference will be made herein to FIGS. 1–4 of the drawings in which like numerals refer to like features of the invention. Features of the invention are not necessarily shown to scale in the drawings.

Figure 4:
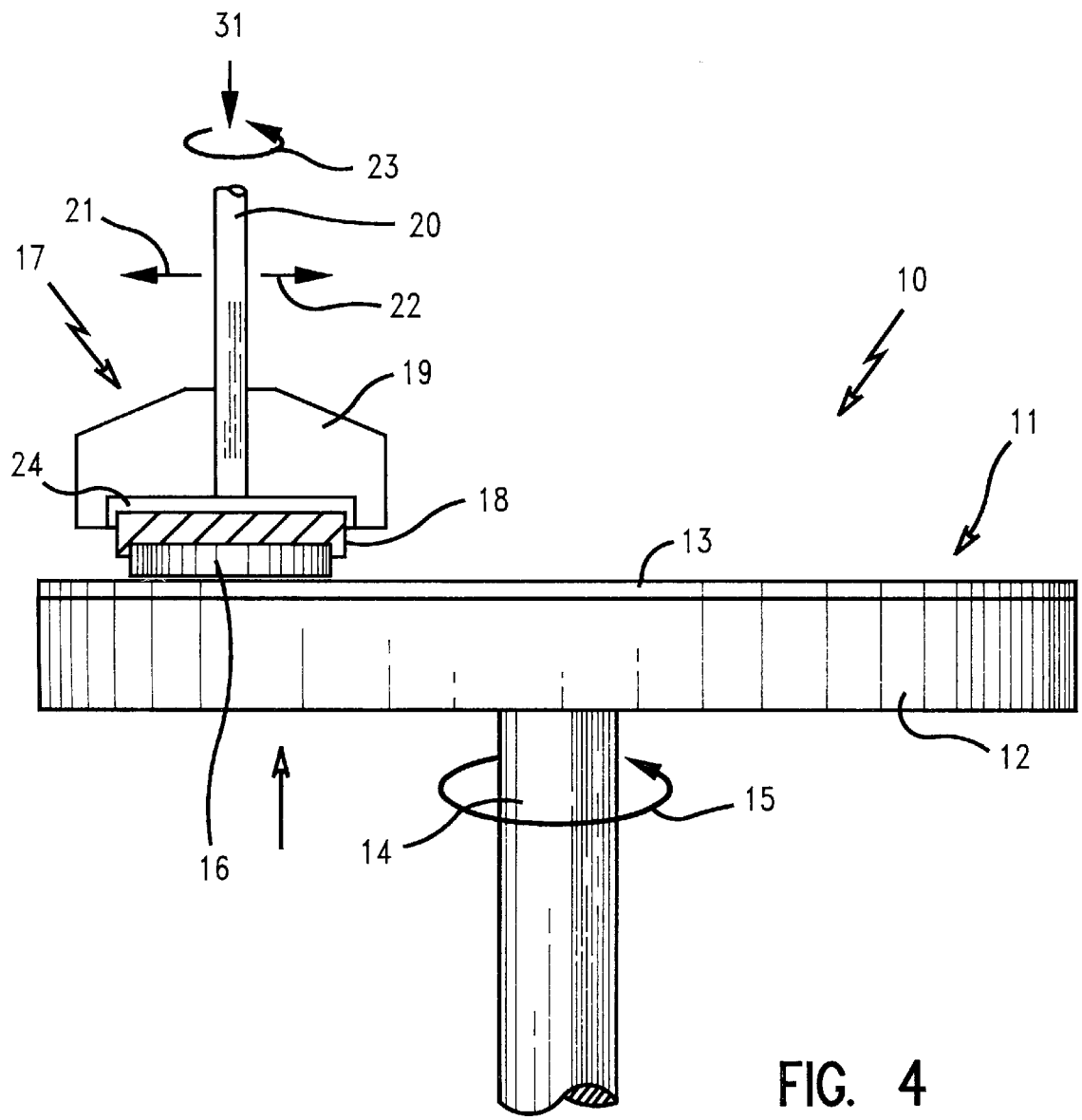
FIG. 4 is schematic illustration of a typical prior art CMP apparatus for polishing a semiconductor wafer.

Referring to the drawings, FIG. 4 shows a prior art CMP apparatus for polishing a semiconductor wafer. The polishing apparatus shown generally as 10 includes a polishing wheel assembly shown generally as 11. The polishing wheel assembly includes a polishing table 12 to which is attached a polishing pad 13. The polishing table 12 is rotated by shaft 14 in the direction indicated by arrow 15 by any suitable motor or driving means (not shown). The polishing pad is typically polyurethane foam and about 22 inch in diameter and 0.050 inch thick.

A wafer carry assembly shown generally as 17 includes a wafer carrier 18 shown holding wafer 16. A pressure plate 19 is secured to the wafer carrier 18 for applying pressure to the wafer carrier and wafer. In the embodiment shown, a hollow spindle 20 is coupled to the pressure plate and is driven by a suitable motor or driving means (not shown) for moving the wafer carrier assembly 17 in the directions shown by the arrows 21, 22 and 23. As shown by the arrow 31, pressure can be applied to the spindle 20 by a weight load and/or a pressurized fluid such as compressed air can be used to exert pressure on the upper surface of wafer carrier 18 by supplying the pressurized fluid to space 24 of the wafer carrier assembly. The force is essentially uniform over the surface of the wafer carrier and wafer.

During polishing, a slurry (not shown) is applied to the surface of the pad 13 and flows between the wafer carried by the wafer carrier assembly 17 and the polishing pad 13 of polishing wheel assembly 11. Due to the pressure which is imposed on the wafer carrier 17 and its rotation and movement over the surface of the polish wheel assembly, the side of the wafer 16 contacting the polishing pad 13 is polished. As discussed hereinabove, due to a number of factors such as overheating, increased slurry at particular portions of the wafer, different rotational speeds at different parts of the wafer, etc., the polished wafers are typically non-planar, and may have one or more of the following characteristics: thick outer edge of wafer; load uniformity within the chip; overall poor cross-wafer uniformity; and inconsistent polishing rate wafer to wafer.

As it is well known in the art, multiple wafers and/or multiple wafer carriers can be simultaneously processed on a single polishing turntable during a polishing operation.

Referring now to FIG. 1, a preferred polishing apparatus 10 and wafer carrier assembly 17 of the invention is shown. A typical polishing wheel assembly 11 including a polishing table 12 and polishing pad 13 may be employed. A rotating shaft 14 revolving as shown by arrow 15 moves the polishing wheel relative to the wafer 16 to be polished as discussed above.

The wafer carrier assembly 17 holds a wafer 16 by a wafer carrier 18. The lower surface of the wafer carrier 18 has a raised peripheral edge shown as 26. The central portion 27 of the wafer carrier in the non-pressurized (non load position) preferably does not contact the upper surface of wafer 16 and the wafer is only contacted at the peripheral edges 26 of the wafer carrier 18. The wafer carrier 18 typically has a retaining ring 33 which surrounds and holds the wafer 16 in place to prevent it from moving out of the wafer carrier assembly 17. Typically the wafer 16 is cemented or otherwise secured to the lower surface of wafer carrier 18.

The wafer carrier 18 is attached to pressure plate 19 which plate is used for applying pressure to the wafer carrier 18 and wafer 16. A pressure plate spindle 20 co-ordinates with wafer carrier assembly space 24 to provide for a pressurized fluid to exert a force (shown by the downward arrow) on the upper surface of the wafer carrier 18. An external load may also be applied to the pressure plate 19 and/or spindle 20 for applying pressure to the wafer carrier 18 and wafer 16. Arrows 32 show the opposed forces exerted on the wafer surface. The wafer carrier assembly is also shown rotating about axis 23. The wafer carrier assembly 17 may also be moved in directions 21 and 22 across the surface of the polishing pad 13.

With regard to wafer carrier 18 of the invention as shown in FIG. 1, it can be seen that the wafer carrier has a raised peripheral edge 26 which is preferably the only part of the wafer carrier contacting the upper side of the wafer 16 when no force is applied to the wafer carrier assembly 17. The wafer 16 is typically secured to the wafer carrier 18 by any suitable means such as an adhesive. During operation of the polishing apparatus 10 a force applied to the wafer carrier assembly 17 will provide a force which varies across the surface of the wafer due to the peripheral edge (non-uniform surface) 26 of the wafer carrier 18. This variable force may be controlled by varying the height and/or width of the peripheral edge 26. It is hypothesized that during polishing the peripheral edge 26 of the wafer carrier 18 provides unequal polishing forces against the surface of the wafer and an enhanced uniform polishing action on the surface of wafer 16. The wafer carrier 18 is typically made of stainless steel and is about 1 inch to 1.5 inch thick to preferably prevent a bending action due to the forces acting against the wafer surface. The raised circumferential edge 26 is preferably about 0.05 mm to 0.1 mm high but may be higher or lower and the width (w) of the circumferential portion is about up to 30%, or more, preferably 5 to 15% of the radius of the wafer carrier. For example, for a 200 mm diameter wafer and wafer carrier, the width of edge 26 is about 10 mm and a height of 0.05 mm. A pressure force shown by arrow 31 is usually applied to wafer carrier assembly 17. It has been found that the use of such a wafer carrier 18 provides enhanced flatness of the polished wafer.

Figure 2:
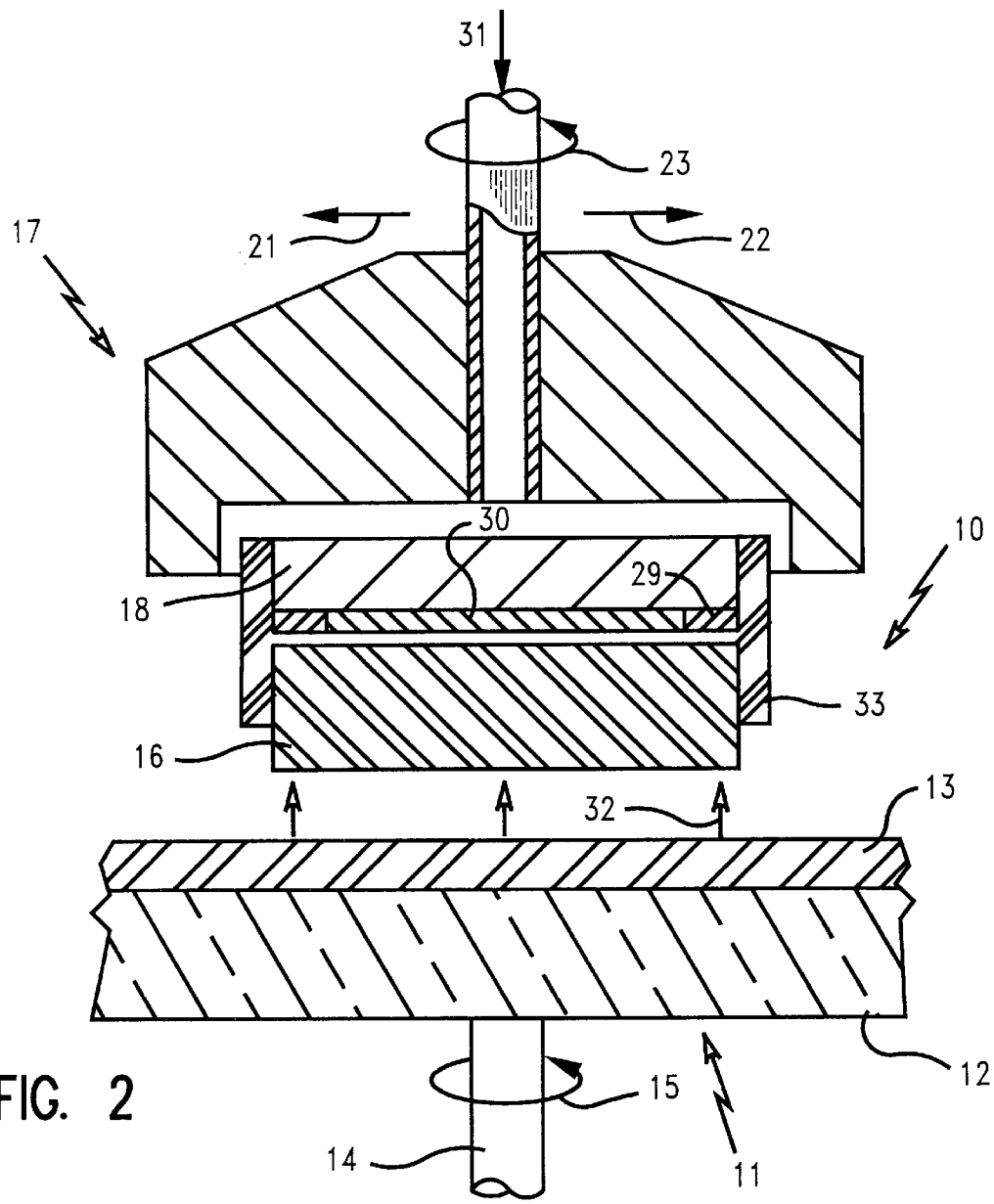
FIG. 2 is a cross-sectional view of a CMP polishing assembly utilizing another wafer carrier of the invention.

With reference to FIG. 2, another embodiment of the invention is shown. Again, polishing apparatus 10 includes a polishing wheel assembly 11 and a wafer carrier assembly 17. The polishing wheel assembly 11 includes a polishing table 12 having thereon a polishing pad 13. The polishing wheel 12 is rotated about shaft 14 in the direction shown by arrow 15. A wafer 16 is secured to the wafer carrier assembly 17 by attachment by adhesive or otherwise to the lower surface of wafer carrier 18. The wafer carrier 18 is shown having a wafer carrier backing film 28 secured to the lower side of the wafer carrier. The wafer carrier backing film 28 comprises a peripheral portion 29 and a central portion 30. The peripheral portion 29 and central portion 30 have different compressibilities and the backing film 28 may be secured to the wafer carrier 18 by any suitable means such as an adhesive. The wafer 16 is then secured to the other side of wafer carrier backing film 28 by adhesive or other means. The wafer carrier 18 typically has a retaining ring 33 to maintain the wafer in the wafer carrier assembly 17 during the polishing operation. The wafer carrier backing film 28 may also be integral with the wafer carrier.

As described in the prior art assembly as shown in FIG. 4, the wafers mounted in the apparatus of the invention shown in FIGS. 1 and 2 are caused to move over the surface of the polishing wheel assembly to polish the surface of wafer 16. A slurry as is well known in the art is used to enhance the polishing action.

As shown in FIG. 2, the wafer carrier 18 has a backing film 28 attached to the lower side of the wafer carrier. Backing film 28 has a peripheral portion 29 having a different compressibility than central portion 30. It is preferred that the wafer carrier backing film periphery 29 have a higher compressibility (be more compressible per unit load) than its central portion 30. In a highly preferred embodiment, the central portion 30 is incompressible and the peripheral portion is compressible. Preferred materials for the central portion are non-compressible such as a polyurethane film. Preferred materials for the peripheral portion are compressible and are preferably a compressible polyurethane (foam or sponge-like).

The thickness of the backing film 28 is preferably uniform and may vary widely up to 5 mm or more, and is preferably about 1–2 mm, e. g., 1.2–1.5 mm. The thickness of the wafer carrier is about 1 inch to 1.5 inch and is typically made of stainless steel. The backing film may be made by forming the central portion on the wafer carrier surface and then forming the peripheral portion and trimming it if necessary. As with the wafer carrier structure 18 shown in FIG. 1, the wafer carrier structure shown in FIG. 2 provides enhanced flatness of a polished wafer 16 due to the backing film structure providing a varied force across the surface of the wafer.

Figure 3:
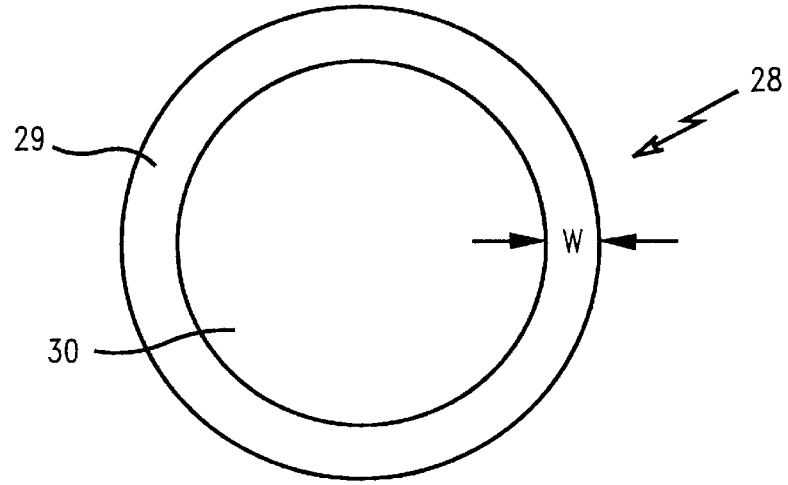
FIG. 3 is a plan view of the wafer carrier of the invention shown in FIG. 2.

FIG. 3 shows a plan view of backing film 28. Peripheral portion 29 has a higher compressibility than central portion 30. The width (w) of peripheral portion 29 may vary widely and may be up to 30%, or more, preferably about 5 to 15% of the radius of wafer carrier 18.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

We claim:

1. An apparatus for polishing a surface on a workpiece comprising:

a rotatable turntable assembly;

a polishing pad supported on said assembly;

a rotatable carrier, located above said assembly and having an upper surface and a lower surface and adapted to hold during polishing a workpiece having an upper surface and a lower surface, with said upper surface of the workpiece contacting the lower surface of the carrier with the workpiece positioned between said carrier and said polishing pad, said lower surface of the carrier having a non-uniform structure comprising a structure selected from the group consisting of a carrier having a flat raised circumferential region which lower surface contacts the upper surface of the workpiece and a central flat recessed portion which flat portion is above the upper surface of the workpiece and a carrier having a lower surface which comprises a central first portion having a predetermined compressibility and a peripheral second portion having a different compressibility than the first portion both first and second portions being in contact with the workpiece before a force is applied to the upper surface of the rotatable carrier;

which when a force is applied to the upper surface of the rotatable carrier to contact the workpiece with the polishing pad the rotatable carrier provides a force which varies across the workpiece surface such that the polishing process imparts a flat polished surface on the lower surface of the workpiece.

2. The apparatus of claim 1 wherein the workpiece is a semiconductor wafer.

3. The apparatus of claim 1 wherein the raised circumferential region of the carrier has a height of about 0.05 to 0.1 mm.

4. The apparatus of claim 3 wherein the width of the circumferential region of the carrier is about 5 to 15% of the radius of the carrier.

5. The apparatus of claim 1 wherein the width of the peripheral second portion to the radius of the wafer carrier is about 5 to 15%.

6. The apparatus of claim 1 wherein the central first portion is substantially incompressible and the peripheral second portion is compressible.

7. The apparatus of claim 6 wherein when the width of the peripheral second portion is about 5 to 15% of the radius of the wafer carrier.

8. The apparatus of claim 7 wherein a backing film having the central first portion and the peripheral second portion is positioned on the wafer carrier surface and secured thereto.

9. A method of polishing a surface on a workpiece employing a polishing apparatus wherein said workpiece has an upper surface and a lower surface and the upper surface is mounted to a lower surface of a rotatable workpiece carrier having an upper surface and a lower surface and the lower surface of the workpiece contacted with a rotating polishing pad to effect a polishing action across said workpiece, which method comprises mounting said upper surface of the workpiece to the lower surface of the carrier comprising a structure selected from the group consisting of a carrier having a flat raised circumferential region which lower surface contacts the upper surface of the workpiece and a central flat recessed portion which flat portion is above the upper surface of the workpiece and a carrier having a lower surface which comprises a central first portion having a predetermined compressibility and a peripheral second portion having a different compressibility than the first portion both first and second portions being in contact with the workpiece before a force is applied to the upper surface of the rotatable carrier;

which lower surface has a non-uniform surface structure which when a force is applied to the upper surface of the carrier to contact the lower surface of the workpiece with the polishing pad the workpiece carrier provides a force which varies across the workpiece surface and imparts a flat polished surface to the lower surface of the workpiece.

10. The method of claim 9 wherein the workpiece is a semiconductor wafer.

11. The method of claim 9 wherein the raised circumferential region of the carrier has a height of about 0.05 to 0.1 mm.

12. The method of claim 11 wherein the width of the circumferential region of the carrier is about 5 to 15% of the radius of the carrier.

13. The method of claim 9 wherein the width of the peripheral second portion to the radius of the wafer carrier is about 5 to 15%.

14. The method of claim 9 wherein the central first portion is substantially incompressible and the peripheral second portion is compressible.

15. The method of claim 14 wherein the width of the peripheral second portion is about 5 to 15% the radius of the wafer carrier.

16. The method of claim 15 wherein a backing film having the central first portion and the peripheral second portion is positioned on the wafer carrier surface and secured thereto.

17. As an article of manufacture, a wafer carrier for holding wafers to be polished on a polishing apparatus the wafer having an upper surface and a lower surface and the carrier comprising an upper surface and a lower surface having a non-uniform surface structure comprising:

a structure selected from the group consisting of a carrier having a flat raised circumferential region which lower surface contacts the upper surface of the workpiece and a central flat recessed portion which flat portion is above the upper surface of the workpiece and a carrier having a lower surface which comprises a central first portion having a predetermined compressibility and a peripheral second portion having a different compressibility than the first portion both first and second portions being in contact with the workpiece before a force is applied to the upper surface of the rotatable carrier;

which lower surface contacts the upper surface of the wafer and when a force is applied to the upper surface of the wafer carrier to contact the lower surface of the wafer with the polishing pad the wafer carrier provides a force which varies across the surface of the wafer and imparts a flat polished surface on the lower surface of the wafer.

* * * * *